United States Patent
Yang

(10) Patent No.: US 9,153,322 B2
(45) Date of Patent: Oct. 6, 2015

(54) MEMORY ARRAY DEVICE AND METHOD FOR REDUCING READ CURRENT OF THE SAME

(71) Applicant: GRACE SEMICONDUCTOR MANUFACTURING CORPORATION, Shanghai (CN)

(72) Inventor: Guangjun Yang, Shanghai (CN)

(73) Assignee: SHANGHAI HUAHONG GRACE SEMICONDUCTOR MANUFACTURING CORPORATION, Shanghai (CN)

( * ) Notice: Subject to any disclaimer, the term of this patent is extended or adjusted under 35 U.S.C. 154(b) by 139 days.

(21) Appl. No.: 13/963,361

(22) Filed: Aug. 9, 2013

(65) Prior Publication Data

US 2014/0085986 A1 Mar. 27, 2014

(30) Foreign Application Priority Data

Sep. 27, 2012 (CN) .......................... 2012 1 0366869

(51) Int. Cl.
| | |
|---|---|
| *G11C 15/04* | (2006.01) |
| *G11C 16/24* | (2006.01) |
| *G11C 16/10* | (2006.01) |
| *G11C 16/26* | (2006.01) |
| *G11C 8/08* | (2006.01) |

(52) U.S. Cl.
CPC ................ *G11C 15/04* (2013.01); *G11C 16/10* (2013.01); *G11C 16/24* (2013.01); *G11C 16/26* (2013.01); *G11C 8/08* (2013.01)

(58) Field of Classification Search
CPC ........ G11C 15/04; G11C 16/10; G11C 16/30; G11C 16/12; G06F 12/1433
See application file for complete search history.

(56) References Cited

U.S. PATENT DOCUMENTS

| | | | |
|---|---|---|---|
| 8,787,059 B1 * | 7/2014 | Iyengar ...................... 365/49.17 |
| 2005/0141284 A1 * | 6/2005 | Futatsuyama ............ 365/185.29 |
| 2007/0039060 A1 * | 2/2007 | Jamieson et al. ................ 726/34 |
| 2008/0232163 A1 * | 9/2008 | Dover ....................... 365/185.03 |
| 2010/0287427 A1 * | 11/2010 | Kim et al. ...................... 714/721 |

* cited by examiner

*Primary Examiner* — Richard Elms
*Assistant Examiner* — Ajay Ojha
(74) *Attorney, Agent, or Firm* — Muncy, Geissler, Olds & Lowe, P.C.

(57) ABSTRACT

A memory array device is disclosed, which includes a plurality of memory array rows, each memory array row including a plurality of subsidiary memory arrays and a switch arranged between every adjacent two subsidiary memory arrays; wherein each subsidiary memory array includes: a memory unit for storing a data; a programming indication bit arranged prior to the memory unit for indicating whether the subsidiary memory array has been programmed; and an inversion indication bit arranged subsequent to the memory unit for indicating whether a data had been inverted before being written in the memory unit of the subsidiary memory array. A method for reducing a read current of a memory array device is also disclosed.

9 Claims, 2 Drawing Sheets

MEMORY ARRAY DEVICE AND METHOD FOR REDUCING READ CURRENT OF THE SAME

CROSS-REFERENCES TO RELATED APPLICATIONS

This application claims the priority of Chinese patent application number 201210366869.9, filed on Sep. 27, 2012, the entire contents of which are incorporated herein by reference.

TECHNICAL FIELD

The present invention relates in general to a memory array device and a method for reducing a read current thereof, and more particularly to an electrically erasable programmable read-only memory (EEPROM) and a method for reducing a read current thereof.

BACKGROUND

An EEPROM is typically made up of a memory array structure which includes one or more memory arrays. Each memory array is comprised of a plurality of regularly arranged memory cells. FIG. 1 shows a memory array structure of an existing memory. It includes a plurality of memory array rows (i.e., row0, row1, ..., rowm). Each memory array row includes two subsidiary memory arrays, a first subsidiary memory array 101 and a second subsidiary memory array 102. A switch is disposed between each first subsidiary memory array 101 and the corresponding second subsidiary memory array 102. Moreover, each subsidiary memory array is comprised of n+1 regularly arranged memory cells b0, b1, ... bn, each of which is configured to record one bit of data.

However, the memory array structure discussed above has a drawback that, when all the memory cells b0, b1, ... bn are erased (i.e., the value stored in each memory cell is set to 1), a read current flowing in the memory array structure comes to a maximum value. This leads to a great read power consumption which is unfavorable for low power consumption applications and may affect the speed of the memory device.

SUMMARY OF THE INVENTION

The present invention addresses the drawback of the prior art by presenting a memory array device and a method for reducing a read current thereof. The invention is capable of reducing read current and read power consumption of a memory and facilitating the increase of its storage speed.

To achieve the above objectives, in a first aspect of the present invention, there is provided a memory array device including a plurality of memory array rows. Each memory array row may include a plurality of subsidiary memory arrays and a switch arranged between every adjacent two subsidiary memory arrays; wherein each subsidiary memory array includes: a memory unit for storing a data; a programming indication bit arranged prior to the memory unit for indicating whether the subsidiary memory array has been programmed; and an inversion indication bit arranged subsequent to the memory unit for indicating whether a data had been inverted before being written in the memory unit of the subsidiary memory array.

Further, the programming indication bit having a value of 0 indicates that the corresponding subsidiary memory array has been programmed, and wherein the programming indication bit having a value of 1 indicates that the corresponding subsidiary memory array has not been programmed.

Further, the inversion indication bit having a value of 0 indicates that the data had been inverted before being written in the memory unit of the subsidiary memory array, and wherein the inversion indication bit having a value of 1 indicates that the data had not been inverted before being written in the memory unit of the subsidiary memory array.

In a second aspect of the present invention, a method for reducing a read current of a memory array device is provided. The method may include the following steps:
  providing a memory array device comprising a plurality of memory array rows, each memory array row including a plurality of subsidiary memory arrays and a switch arranged between every adjacent two subsidiary memory arrays, each subsidiary memory array including a memory unit for storing a data;
  arranging a programming indication bit prior to the memory unit and an inversion indication bit subsequent to the memory unit of each subsidiary memory array;
  programming one or more subsidiary memory arrays of the memory array device, including:
    setting the inversion indication bit of a currently programming subsidiary memory array to a certain value following a predetermined rule; and
    setting the programming indication bit of the currently programming subsidiary memory array to a value which indicates that the subsidiary memory array has been programmed; and
  writing both a data or an inversion of the data, according to the set value of the inversion indication bit, and the set value of the inversion indication bit in the programmed subsidiary memory array.

Further, the method may further include:
  reading one or more subsidiary memory arrays of the memory array device, including:
    reading the programming indication bit of a currently reading subsidiary memory array to determine whether the subsidiary memory array has been programmed, and
    outputting '1' if the subsidiary memory array has not been programmed; or
    if the subsidiary memory array has been programmed, reading out the stored data subsequent to the programming indication bit, checking the inversion indication bit of the subsidiary memory array, and outputting the stored data or an inversion of the stored data based on the value of the inversion indication bit of the subsidiary memory array.

Further, outputting the stored data or an inversion of the stored data based on the value of the inversion indication bit of the subsidiary memory array includes:
  outputting the stored data if the value of the inversion indication bit indicates that the data had not been inverted before being written in the memory unit of the subsidiary memory array; or
  outputting an inversion of the stored data if the value of the inversion indication bit indicates that the data had been inverted before being written in the memory unit of the subsidiary memory array.

Further, the predetermined rule may be that,
  if a number of bits, having a value of 1, of a data to be written in a currently programming subsidiary memory array reaches or exceeds half of a total number of bits of the data, the inversion indication bit of the subsidiary memory array is set to a value indicating that the data had been inverted before being written in the memory unit of the subsidiary memory array, and an inversion of the data and the set value of the inversion indication bit are written in the subsidiary memory array; or if a number of bits, having a value of 1, of the data to be written in a currently programming subsidiary memory array is smaller than half of a total number of bits of the data, the inversion indication bit of the subsidiary memory array is set to a value indicating that the data had not been inverted before being written in the memory unit of the subsidiary memory array, and the data and the set value of the inversion indication bit are written in the subsidiary memory array.

Further, if the number of bits, having a value of 1, of the data to be written in the currently programming subsidiary memory array reaches or exceeds half of the total number of bits of the data, the value of the inversion indication bit is set to 0, otherwise to 1.

Further, the programming indication bit of the subsidiary memory array is set to 0 to indicate that the subsidiary memory array has been programmed.

Compared with the prior art, the present invention can reduce read current and read power consumption of memory devices and facilitate the increase of their storage speeds, by arranging a programming indication bit prior to the first bit of each subsidiary memory array and an inversion indication bit subsequent to its last bit, setting the indication bits when programming the device, and performing corresponding operations according to values of the set indication bits when reading data from the device.

DETAILED DESCRIPTION

To further describe the present invention, reference is made to the following detailed description on exemplary embodiments, taken in conjunction with the accompanying drawings. Other advantages and beneficial effects of the invention will become readily apparent to those skilled in the art upon reading the following description. The invention may be embodied in many different forms from the exemplary ones and various modifications and variations can be made to details of the exemplary ones without departing from the present teachings.

Figure 1:
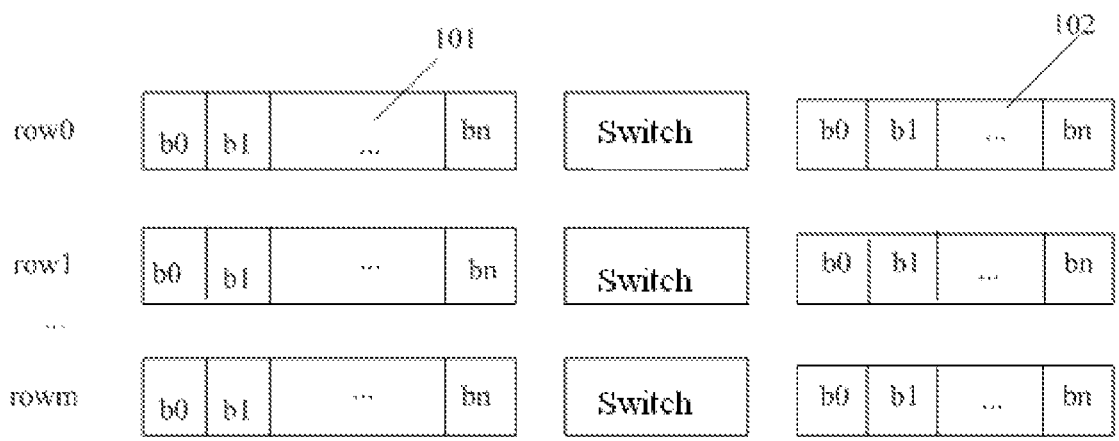
FIG. 1 shows a schematic illustration of a memory array device of the prior art.
Figure 2:
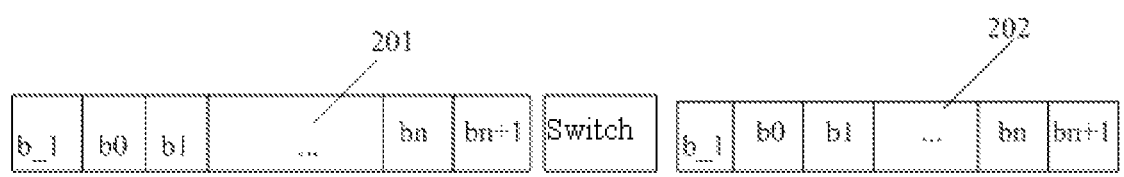
FIG. 2 schematically illustrates a memory array row of a preferred embodiment of a memory array device constructed in accordance with the present invention.

FIG. 2 shows a memory array row of a preferred embodiment of a memory array device embodying the present invention. The memory array device includes a plurality of memory array rows, each of which includes a plurality of subsidiary memory arrays. Moreover, in each memory array row, a switch is arranged between every two adjacent subsidiary memory arrays. As shown in FIG. 2, in the preferred embodiment, each memory array row may include two subsidiary memory arrays, namely a first subsidiary memory array 201 and a second subsidiary memory array 202, and a switch is arranged between the first and second subsidiary memory arrays 201, 202. Additionally, each subsidiary memory array includes a memory unit comprised of n+1 regularly arranged memory cells, b0, b1, . . . , bn, each of which is configured to record one bit of data. For each subsidiary memory array (e.g., the first subsidiary memory array 201 or the second subsidiary memory array 202), a programming indication bit b_1 is arranged prior to its first bit and an inversion indication bit bn+1 is arranged subsequent to its last bit. The programming indication bit b_1 is configured to record the information indicative of whether the corresponding subsidiary memory array has been programmed. Specifically, it indicates that the corresponding subsidiary memory array has been programmed if its value is 0, and that the corresponding subsidiary memory array has not been programmed when its value is 1. The inversion indication bit bn+1 is configured to indicate whether a corresponding data had been inverted before it was written in the subsidiary memory array. Specifically, it indicates that the data had been inverted before it was written in if its value is 0, and that the data had not been inverted before it was written in if its value is 1.

Figure 3:
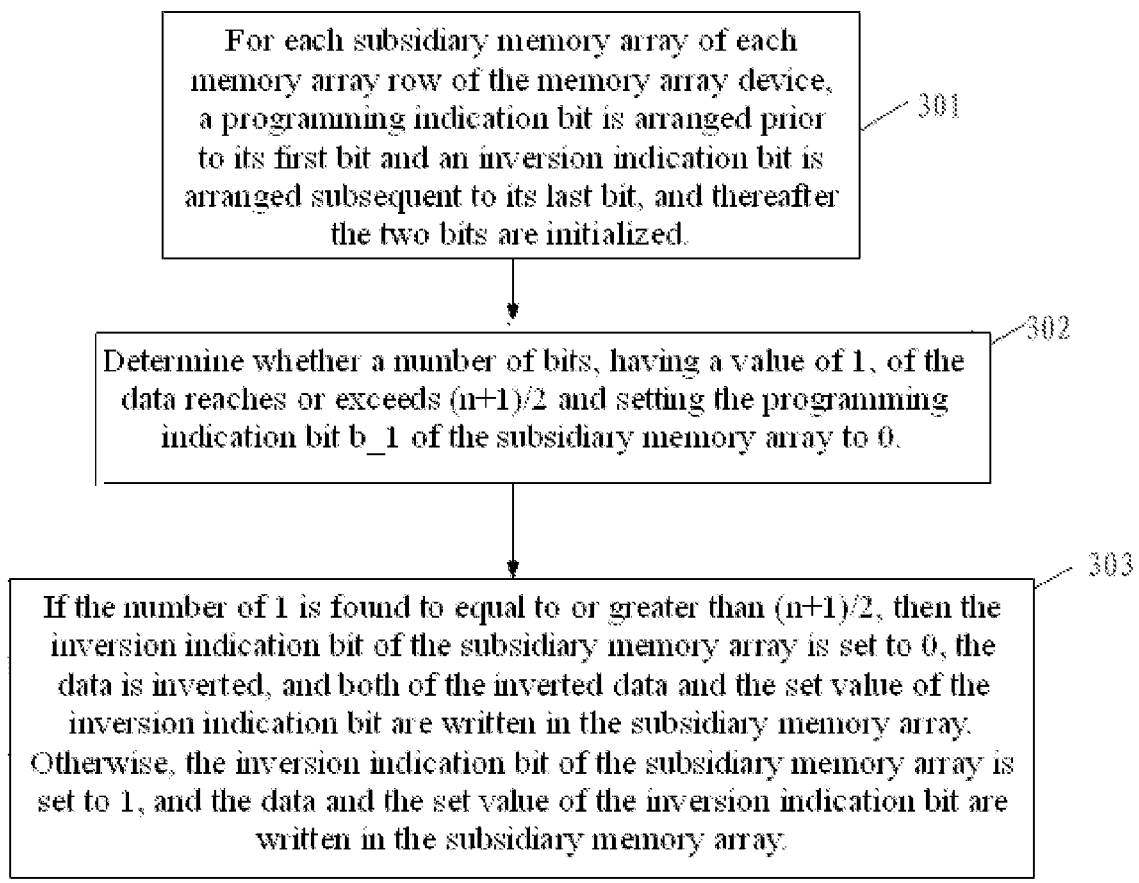
FIG. 3 shows a flow chart depicting a method of reducing a read current of a memory array device in accordance with the present invention.

FIG. 3 shows a flow chart depicting a method of reducing a read current of a memory array device in accordance with the present invention. As shown in figure, the method may include the following steps 301 to 303.

In the step 301, for each subsidiary memory array of each memory array row of the memory array device, a programming indication bit b_1 is arranged prior to its first bit and an inversion indication bit bn+1 is arranged subsequent to its last bit, and thereafter the bits b_1, bn+1 are initialized.

In the step 302, when to program one or more subsidiary memory arrays of the memory array device, an (n+1)-bit data, b0, b1, . . . , bn that is to be written in a subsidiary memory array is checked to determine whether a number of bits, having a value of 1, of the data reaches or exceeds half of a total number of bits of the data, i.e., whether the number of 1's is not smaller than (n+1)/2.

In the step 303, if the number of 1's is found to equal to or greater than (n+1)/2, then the inversion indication bit bn+1 of the subsidiary memory array is set to 0, the data b0, b1, . . . , bn is inverted, and both of the inverted data and the set value of the inversion indication bit bn+1 (i.e., 0) are written in the subsidiary memory array. Otherwise, the inversion indication bit bn+1 of the subsidiary memory array is set to 1, and the data and the set value of the inversion indication bit bn+1 (i.e., 1) are written in the subsidiary memory array.

Correspondingly, when to read the memory array device, the programming indication bit b_1 of a current subsidiary memory array is first read to determine whether the subsidiary memory array has been programmed.

Next, if the subsidiary memory array is found to have not been programmed, no read operation is performed on the subsidiary memory array and '1' is output.

Otherwise, if the subsidiary memory array is found to have been programmed, the data, b0, b1, . . . bn, stored subsequent to the programming indication bit b_1 is read, and the inversion indication bit bn+1 that is arranged subsequent to the subsidiary memory array is checked.

If the result of the checking shows that the data had been inverted before it was written in the subsidiary memory array (i.e., it is found that the value of bn+1 is 0), then the data is inverted and output. Otherwise, if the result shows that the data had not been inverted before it was written in the subsidiary memory array (i.e., it is found that the value of bn+1 is 1), then the data is output directly.

Principle of the present invention will be further described hereinafter with reference to a specific embodiment and with continuing reference to FIGS. 2 and 3. In this embodiment, when to read the memory array device, the bit b_1 is first read. If the value of the bit b_1 is 1, it is indicated that the current subsidiary memory array has not been programmed, i.e., each memory cell of the subsidiary memory array records a bit having a value of 1. Otherwise, if the value of the bit b_1 is 0, it is indicated that the subsidiary memory array has been programmed and the data stored therein can be read out. After the data is read out, the bit bn+1 is checked. If the value of the bit bn+1 is 0, it is indicated that the data had been inverted before it was recorded in the subsidiary memory array and therefore needs to be inverted again before it is output. Otherwise, if the value of the bit bn+1 is 1, it is indicated that the data had not been inverted before it was recorded and can be output directly. Correspondingly, when to program the memory array device, an (n+1)-bit data, b0, b1, . . . bn, that is to be recorded in a current subsidiary memory array is first checked to find whether a number of bits, having a value of 1, contained in it is not smaller than (n+1)/2. If it is found that the number is greater than or equal to (n+1)/2, then the value of the bit bn+1 is set to 0, the data is inverted, and both the inverted data and the value of the inversion indication bit (i.e., 0) are written in the subsidiary memory array. As such, the number of 1's written in the memory array device is smaller than (n+1)/2, and hence a reduced read current is required to read the data. On the other hand, if it is found that the number of bits having a value of 1 is smaller than half of a total number of bits of the data (i.e., smaller than (n+1)/2), then the value of the bit bn+1 is set to 1 and both the data and the value of the inversion indication bit (i.e., 1) are written in the subsidiary memory array. As such, the number of 1's written in the memory array device is also smaller than (n+1)/2, and similarly, the current for reading the bits, b0, b1, . . . , bn+1 is reduced.

Therefore, the memory array device and method of the present invention can reduce read current and hence read power consumption of a memory and facilitate the increase of its storage speeds, by arranging a programming indication bit prior to the first bit of each subsidiary memory array and an inversion indication bit subsequent to its last bit thereof, setting the state indication bits when to program the device, and performing corresponding operations according to values of the set state indication bits when to read data from the device.

The specific embodiments disclosed above are solely some examples for describing the principles and beneficial effects of the present invention and are not intended to limit the invention in any way. Those skilled in the art can make various modifications and variations without departing from the scope of the invention. Thus, it is intended that the scope of the present invention is as defined in the appended claims.

What is claimed is:

1. A memory array device comprising a plurality of memory array rows, each memory array row including a plurality of subsidiary memory arrays and a switch arranged between every adjacent two subsidiary memory arrays;
    wherein each subsidiary memory array includes:
    a memory unit for storing a data;
    a programming indication bit arranged prior to the memory unit for indicating whether the subsidiary memory array has been programmed; and
    an inversion indication bit arranged subsequent to the memory unit for indicating whether a data had been inverted before being written in the memory unit of the subsidiary memory array.

2. The memory array device according to claim 1, wherein the programming indication bit having a value of 0 indicates that the corresponding subsidiary memory array has been programmed, and wherein the programming indication bit having a value of 1 indicates that the corresponding subsidiary memory array has not been programmed.

3. The memory array device according to claim 1, wherein the inversion indication bit having a value of 0 indicates that the data had been inverted before being written in the memory unit of the subsidiary memory array, and wherein the inversion indication bit having a value of 1 indicates that the data had not been inverted before being written in the memory unit of the subsidiary memory array.

4. A method for reducing a read current of a memory array device, comprising the following steps:
    providing a memory array device comprising a plurality of memory array rows, each memory array row including a plurality of subsidiary memory arrays and a switch arranged between every adjacent two subsidiary memory arrays, each subsidiary memory array including a memory unit for storing a data;
    arranging a programming indication bit prior to the memory unit and an inversion indication bit subsequent to the memory unit of each subsidiary memory array;
    programming one or more subsidiary memory arrays of the memory array device, including:
        setting the inversion indication bit of a currently programming subsidiary memory array to a certain value following a predetermined rule; and
        setting the programming indication bit of the currently programming subsidiary memory array to a value which indicates that the subsidiary memory array has been programmed;
    writing both a data or an inversion of the data, according to the set value of the inversion indication bit, and the set value of the inversion indication bit in the programmed subsidiary memory array; and
    reading one or more subsidiary memory arrays of the memory array device, including:
        reading the programming indication bit of a currently reading subsidiary memory array to determine whether the subsidiary memory array has been programmed, and outputting '1' if the subsidiary memory array has not been programmed.

5. The method according to claim 4,
    wherein reading one or more subsidiary memory arrays of the memory array device further including:
    if the subsidiary memory array has been programmed, reading out the stored data subsequent to the programming indication bit, checking the inversion indication bit of the subsidiary memory array, and outputting the stored data or an inversion of the stored data based on the value of the inversion indication bit of the subsidiary memory array.

6. The method according to claim 5, wherein outputting the stored data or an inversion of the stored data based on the value of the inversion indication bit of the subsidiary memory array includes:
    outputting the stored data if the value of the inversion indication bit indicates that the data had not been inverted before being written in the memory unit of the subsidiary memory array; or
    outputting an inversion of the stored data if the value of the inversion indication bit indicates that the data had been inverted before being written in the memory unit of the subsidiary memory array.

7. The method according to claim 4, wherein the predetermined rule is that,
    if a number of bits, having a value of 1, of a data to be written in a currently programming subsidiary memory array reaches or exceeds half of a total number of bits of the data, the inversion indication bit of the subsidiary memory array is set to a value indicating that the data had been inverted before being written in the memory unit of the subsidiary memory array, and an inversion of the data and the set value of the inversion indication bit are written in the subsidiary memory array; or if a number of bits, having a value of 1, of the data to be written in a currently programming subsidiary memory array is smaller than half of a total number of bits of the data, the inversion indication bit of the subsidiary memory array is set to a value indicating that the data had not been inverted before being written in the memory unit of the subsidiary memory array, and the data and the set value of the inversion indication bit are written in the subsidiary memory array.

8. The method according to claim 7, wherein if the number of bits, having a value of 1, of the data to be written in the currently programming subsidiary memory array reaches or exceeds half of the total number of bits of the data, the value of the inversion indication bit is set to 0, otherwise to 1.

9. The method according to claim 4, wherein the programming indication bit of the subsidiary memory array is set to 0 to indicate that the subsidiary memory array has been programmed.

* * * * *